United States Patent [19]

Ueno

[11] Patent Number: 4,625,129

[45] Date of Patent: Nov. 25, 1986

[54] ELECTRONIC CIRCUIT DEVICE HAVING A POWER SUPPLY LEVEL SWITCHING CIRCUIT

[75] Inventor: Kouji Ueno, Kawasaki, Japan

[73] Assignee: Fujitsu Limited, Kawasaki, Japan

[21] Appl. No.: 536,000

[22] Filed: Sep. 26, 1983

[30] Foreign Application Priority Data

Sep. 30, 1982 [JP] Japan ................................ 57-169544

[51] Int. Cl.[4] ................. H03K 19/086; H03K 19/088
[52] U.S. Cl. ..................................... 307/446; 307/443;
307/455; 307/456; 307/362; 307/296 R;
307/310; 307/318
[58] Field of Search ................ 307/443, 446, 454–456,
307/466–467, 358, 362, 363, 296 R, 310, 318;
364/716; 365/226; 340/660–661

[56] References Cited

U.S. PATENT DOCUMENTS

| | | | |
|---|---|---|---|
| 3,909,636 | 9/1975 | Masaki et al. | 307/443 X |
| 4,152,696 | 5/1979 | Smith | 307/350 X |
| 4,184,087 | 1/1980 | Nutz | 307/358 X |
| 4,200,918 | 4/1980 | Glock et al. | 365/210 |
| 4,290,119 | 9/1981 | Masuda et al. | 365/189 |
| 4,301,380 | 11/1981 | Thomas | 307/358 X |
| 4,349,750 | 9/1982 | Geurts | 307/455 X |
| 4,356,414 | 10/1982 | Güntner et al. | 307/455 |
| 4,399,524 | 8/1983 | Muguruma et al. | 365/229 |
| 4,481,430 | 11/1984 | Houk et al. | 307/456 X |
| 4,498,022 | 2/1985 | Koyama et al. | 307/443 X |

FOREIGN PATENT DOCUMENTS

| | | |
|---|---|---|
| 0083208 | 7/1983 | European Pat. Off. . |
| 51-48944 | 4/1976 | Japan . |
| 1197071 | 7/1970 | United Kingdom . |

OTHER PUBLICATIONS

European Search Report, The Hague, Nov. 27, 1985, Examiner: A. G. W. Davis.

Primary Examiner—Stanley D. Miller
Assistant Examiner—D. R. Hudspeth
Attorney, Agent, or Firm—Staas & Halsey

[57] ABSTRACT

An electronic circuit device, such as an integrated circuit device, includes circuit portions which are not all used at the same time, for example, ECL-type circuits and TTL-type circuits. The electronic circuit device includes at least one power terminal commonly provided for all of the circuit portions and a control circuit for activating part of the circuit portions in accordance with the potential of a power source voltage applied to the power terminal or terminals.

18 Claims, 6 Drawing Figures

ECL MODE   TTL MODE

ELECTRONIC CIRCUIT DEVICE HAVING A POWER SUPPLY LEVEL SWITCHING CIRCUIT

BACKGROUND OF THE INVENTION

1. Field of the Invention

The present invention relates to an electronic circuit device and more particularly to an integrated circuit device having a plurality of circuit portions, such as emitter-coupled logic (ECL) circuits and transistor-transistor logic (TTL) circuits, formed in the same semiconductor chip, the circuit portions being selectively activated by controlling the power supply voltage.

2. Description of the Prior Art

In general, ECL circuits have the characteristic of a high operating speed, but it is difficult for them to handle large current signals. On the other hand, TTL circuits have the characteristics of a relatively slow operating speed, but it is easy for them to handle large current signals. Therefore, if both types of circuits are used in one integrated circuit (IC) device, it is possible to realize a high performance IC device in which the characteristic of each of the circuits is well utilized.

For example, there is a known programmable read-only memory (ROM) semiconductor IC device which uses both ECL circuits and TTL circuits (Japanese Unexamined Patent Publication No. 51-48944). In this conventional IC device, however, power supply voltages for the ECL circuits and for the TTL circuits are applied to separate power terminals each provided for the TTL or ECL circuits. Therefore, the number of power terminals is large and the switching operation is complicated.

SUMMARY OF THE INVENTION

In order to solve the above-mentioned problems of a conventional IC device which utilizes both ECL circuits and TTL circuits, the present invention provides for automatically switching between operation of the ECL circuits and the TTL circuits when the voltage changes at a power terminal commonly provided for both types of circuits.

It is an object of the present invention to decrease the number of power terminals and to simplify the switching operation for the activation of each circuit portion in an electronic circuit device having a plurality of circuit portions which are not all used at the same time.

According to the present invention, there is provided an electronic circuit device having a plurality of circuit portions which are not all used at the same time, the electronic circuit device comprising at least one power terminal commonly provided for the plurality of circuit portions and control circuitry for activating part of the circuit portions in accordance with the potential of the power source voltage applied to the power terminal or terminals.

DESCRIPTION OF THE PREFERRED EMBODIMENTS

Figure 1:
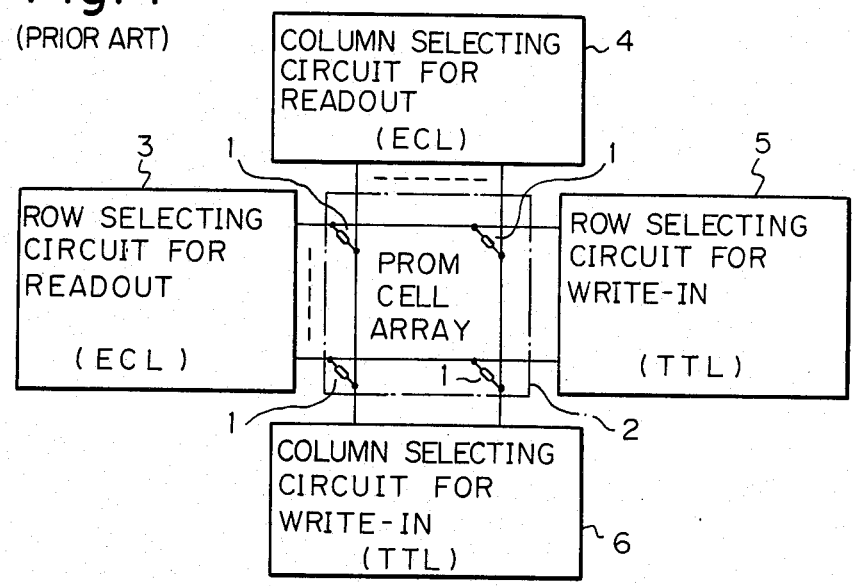
FIG. 1 is a block circuit diagram of an example of a conventional ECL-TTL circuit.

Before describing the preferred embodiments, a conventional electronic circuit device having a plurality of circuit portions which are not all used at the same time is described. FIG. 1 illustrates a programmable ROM semiconductor IC device which is disclosed in Japanese Unexamined Patent Publication No. 51-48944 and which includes both ECL circuits and TTL circuits. The device of FIG. 1 comprises a cell array 2 in which programmable junction-shorting-type memory cells 1, etc. are arranged, row-selecting circuits 3 and 5 and column-selecting circuits 4 and 6 which are coupled to the cell array 2, etc. The row-selecting circuit 3 is for readout and the row-selecting circuit 5 is for write-in, and the column-selecting circuit 4 is for readout and the column-selecting circuit 6 is for write-in. Each of the selecting circuits 3 and 4 for readout is constructed using ECL circuits in order to increase the readout speed, and each of the selecting circuits 5 and 6 for write-in constructed using TTL circuits which can handle large current signals.

In the above-mentioned conventional device, however, since the ECL circuits are activated by applying a negative voltage to a power terminal $V_{EE}$ for the ECL circuits when a readout operation is performed and since the TTL circuits are activated by applying a positive voltage to a power terminal $V_{CC}$ for the TTL circuits when a write-in operation is performed, the number of power terminals is large and the switching operation is complicated.

According to the present invention, there is provided an electronic circuit device which overcomes these problems.

Figure 2:
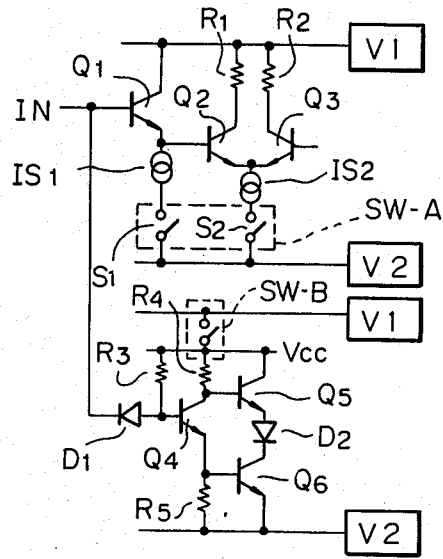
FIG. 2 is an electrical circuit diagram illustrating the principle of operation for an IC device according to an embodiment of the present invention.

The embodiments of the present invention are explained with reference to the drawings. FIG. 2 illustrates the principle of an IC device which is an embodiment of the present invention. In FIG. 2, transistors Q1, Q2, and Q3, constant current sources IS1 and IS2, etc. are part of an ECL on first function circuit. The transistor Q1 is an input emitter follower, the emitters of the transistors Q2 and Q3 being commonly connected to each other and to a terminal of the constant current source IS2 and the collectors of the transistors Q1 and Q2 being connected to a power terminal V1 through resistors R1 and R2, respectively. The emitter of the transistor Q1 is connected to a power terminal V2 through the constant current source IS1 and the first switch circuit S1 of a switch SW-A. The other terminal of the constant current source IS2 is connected to the power terminal V2 through the second switch circuit S2 of the switch SW-A.

In FIG. 2, diodes D1 and D2, transistors Q4, Q5, and Q6, and resistors R3, R4, and R5 comprise a TTL or second function circuit. The base of the transistor Q4 is connected to an input terminal IN through the diode D1, and the input terminal IN is connected to the base of the transistor Q1, i.e., an input terminal of the aforementioned ECL circuit. Therefore, the input terminal IN is commonly provided for the TTL circuit and the ECL circuit. The base and the collector of the transistor Q4 are connected to an internal power line $V_{CC}$ through the resistors R3 and R4, respectively, and the emitter of the transistor Q4 is connected to the base of transistor $Q_6$ and to the power terminal V2, the same one used by the ECL circuit, through the resistor R5. The collector of the transistor Q4 is also connected to the base of the transistor Q5. The transistor Q5, the diode D2, and the transistor Q6 are connected between the internal power line $V_{CC}$ and the power terminal V2. The internal power line $V_{CC}$ is connected to the power terminal V1, the same one used by the ECL circuit, through a switch SW-B. A level shift element (not shown), for example, a Zener diode, is connected, if necessary, to the switch SW-B to supply different power supply voltages to the ECL circuit and the TTL circuit.

In the circuit of FIG. 2, both of the switches SW-A and SW-B operate to turn on or off in accordance with the voltage difference between the power terminals V1 and V2. For example, when $V1-V2=15$ volts, the switch SW-A is turned off and the switch SW-B is turned on and thereby the TTL circuit assumes an active state. On the contrary, when, for example, $V1-V2=-5.2$ volts, both of the switch circuits S1 and S2 of the switches SW-A are turned on and the switch SW-B is turned off and thereby the ECL circuit is activated.

Figure 3:
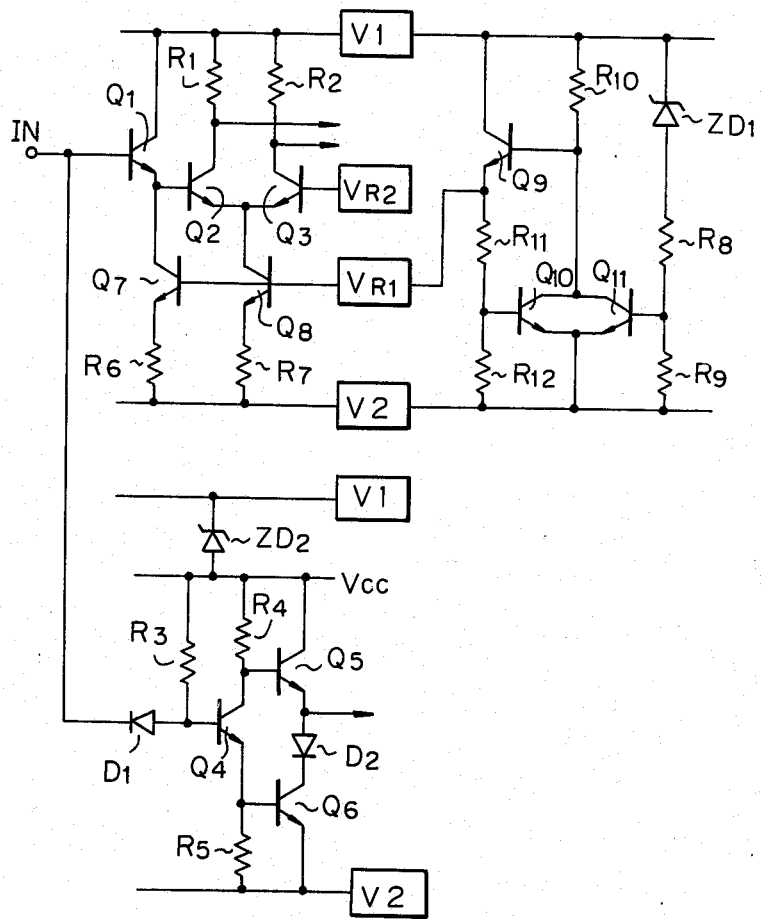
FIG. 3 is an electrical circuit diagram of a practical circuit corresponding to the circuit of FIG. 2.

FIG. 3 illustrates the circuit of FIG. 2 in a practical form. In the circuit of FIG. 3, the switch circuit S1 of the switch SW-A and the constant current source IS1 are realized by a transistor Q7 and an emitter resistor R6, and the switch circuit S2 and the constant current source IS2 are realized by a transistor Q8 and an emitter resistor R7. A reference or supply voltage is applied via a voltage supply terminal $V_{R1}$ to the base of each of these transistors. The reference voltage is generated by a reference voltage generator circuit which includes transistors Q9 and Q10, resistors R10, R11, and R12 the voltage supply terminal $V_{R1}$ and a voltage detector circuit. The voltage detector circuit includes a transistor Q11 connected parallel to the transistor Q10, a Zener diode ZD1, and resistors R8 and R9. The switch SW-B and a level shift element in the TTL circuit are realized by one Zener diode ZD2. Both of the Zener diodes ZD1 and ZD2 have a Zener voltage of, for example, 10 volts.

Figure 4:
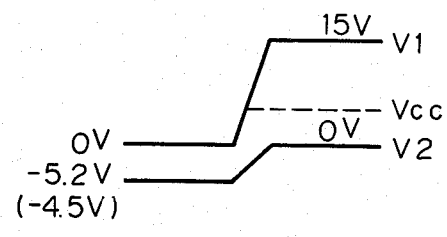
FIG. 4 illustrates the relationships between the operation modes and the power supply voltages.

The circuit of FIG. 3 operates in an ECL mode when, for example, the potential of the power terminal V1 is 0 V and the potential of the power terminal V2 is $-5.2$ volts or $-4.5$ volts, as is illustrated in FIG. 4. Under these conditions, the Zener diode ZD2 connected to the voltage supply terminal $V_{CC}$ of the TTL circuit is cut off so that the TTL circuit is not activated. The Zener diode ZD1 of the voltage detector circuit connected to the reference voltage generator circuit of the ECL circuit is cut off and the transistor Q11 is turned off. Therefore, the reference voltage generator circuit supplies a normal reference voltage via the voltage supply terminal $V_{R1}$ to the bases of the transistors Q7 and Q8 and thereby the ECL circuit is activated. Consequently, an input signal applied to an input terminal IN is amplified by the transistors Q1, Q2, Q3, etc. to generate an inverted signal and a non-inverted signal, and the inverted and non-inverted signals are output from the collectors of the transistors Q2 and Q3, respectively.

Next, when the potential of the power terminal V1 is 15 volts and the potential of the power terminal V2 is 0 volts, the circuit of FIG. 3 operates in a TTL mode. That is, in this condition, since the transistor Q11 of the above-mentioned voltage detector circuit connected to the ECL circuit is turned on, the transistor Q9 of the above-mentioned reference voltage generator circuit is cut off. Therefore, the reference voltage supplied by the voltage supply terminal $V_{R1}$ becomes 0 volts, both of the transistors Q7 and Q8 of the constant current source circuit of the ECL circuit are cut off, and the ECL circuit assumes an inactive state. On the other hand, the Zener diode ZD2 of the TTL circuit assumes an active state, and if the Zener voltage thereof is at least 10 volts, a circuit power voltage of 5 volts is applied to the TTL circuit via the voltage supply terminal $V_{CC}$. Therefore, the TTL circuit assumes an active state, and the input signal applied from the input terminal is inverted and amplified by the transistors Q4, Q5, Q6, etc. and is output therefrom.

Figure 5:
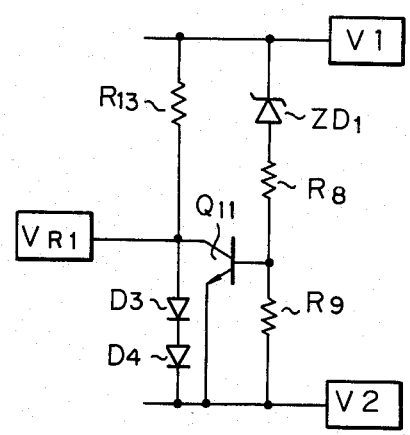
FIGS. 5 and 6 are electrical circuit diagrams of reference voltage generator circuits usable in the circuit of FIG. 3.
Figure 6:
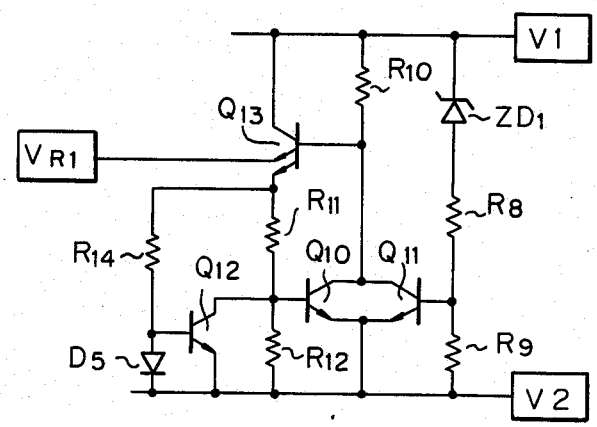

It should be noted that the reference voltage generator circuit used in the circuit of FIG. 3 can be replaced with the circuit of FIG. 5 or FIG. 6. In the circuit of FIG. 5, the reference voltage supplied by the voltage supply terminal $V_{R1}$ is stabilized by using the forward-biased voltages of the diodes D3 and D4, to which a current flows from a resistor R13. In the circuit of FIG. 6, the transistor Q9 in the circuit of FIG. 3 is replaced with a multi-emitter transistor Q13, and a circuit comprising a transistor Q12, a resistor R14, and a diode D5 is added to improve the temperature characteristic of the ECL circuit.

As was mentioned above, according to the present invention, power terminals are used in common by an ECL circuit and a TTL circuit. Activation of the ECL circuit and the TTL circuit is switched by changing the voltages of the power terminals. Since the IC device according to the present invention does not require separate power terminals for different types of circuits, as does the conventional IC device, it is possible to decrease the number of power terminals and to simplify the operation for switching the activation of different types of circuits.

I claim:

1. An electronic circuit device receiving a power source voltage having a level, comprising:
   circuit portions including first and second groups, the first group requiring a first power supply level and the second group requiring a second power supply level different from the first power supply level;
   first and second power terminals, operatively connected to all of the circuit portions, receiving the power source voltage thereacross; and
   control means, operatively connected to said circuit portions and said first and second power terminals for activating one of the first and second groups of said circuit portions in dependence upon the level of the power source voltage applied to said power terminals.

2. An electronic circuit device on a single integrated circuit chip, said device comprising:
   power terminals receiving thereacross a power source voltage having a level;
   circuit portions comprising:
      an emitter-coupled-logic-type circuit operatively connected to said power terminals; and
      a transistor-transistor-logic-type circuit operatively connected to said power terminals; and
      control means, operatively connected to said power terminals and said emitter-coupled-logic-type circuit and said transistor-transistor-logic-type circuit, for activating one of said emitter-coupled-logic-type circuit and said transistortransistor-logic-type circuit in dependence upon the level of the power source voltage.

3. An electronic circuit device as recited in claim 2, wherein said control means comprises a reference voltage generator circuit, comprising a voltage detector circuit, operatively connected to said power terminals and at least one of the circuit portions, for detecting the power source voltage and for supplying different reference voltages in dependence upon the level of the power source voltage.

4. An electronic circuit device as recited in claim 3, wherein the different reference voltages are applied to said emitter-coupled-logic-type circuit and thereby the activation of said emitter-coupled-logic-type circuit is controlled by the level of the power source voltage.

5. An electronic circuit device as recited in claim 4, wherein said emitter-coupled-logic-type circuit comprises a constant current source comprising a transistor operatively connected to said reference voltage generator circuit to receive the different reference voltages.

6. An electronic circuit device as recited in claim 3, wherein said voltage detector circuit comprises:
a Zener diode, operatively connected to said power terminal; and
a transistor, operatively connected to said Zener diode, for controlling the different reference voltages.

7. An electronic circuit device as recited in claim 2, wherein said control means comprises a Zener diode, operatively connected to said power terminal and said transistor-transistor-logic-type circuit, conducting in dependence upon the level of the power source voltage, the activation of said transistor-transistor-logic-type circuit thereby being controlled by the level of the power source voltage.

8. An electronic circuit device, operatively connected to receive a power source voltage having a level, comprising:
power terminals operatively connected to receive the power source voltage;
switching means, operatively connected to said power terminals, comprising first and second voltage supply terminals, for connecting said power terminal to only one of the first and second voltage supply terminals in accordance with the level of the power source voltage; and
first and second function circuits, operatively connected to the first and second voltage supply terminals, respectively, for performing a function when supplied with power from a corresponding one of said first and second voltage supply terminals.

9. An electronic circuit device as recited in claim 8, wherein said switching means further comprises a reference voltage generator circuit, operatively connected to said power terminal and said first voltage supply terminal, for generating a first supply voltage for the first function circuit when the level of the power supply voltage is a first level.

10. An electronic circuit device as recited in claim 9, wherein said reference voltage generator circuit comprises:
a first Zener diode operatively connected to said power terminal; and
a first transistor operatively connected to said Zener diode and the first voltage supply terminal.

11. An electronic circuit device, operatively connected to receive a power supply voltage having a level, comprising:
first and second power terminals operatively connected to receive the power supply voltage;
switching means, operatively connected to said first and second power terminals, for supplying power along a route determined in dependence upon the level of the power supply voltage, comprising:
a first Zener diode operatively connected across said first and second power terminals;
a transistor operatively connected to said first and second power terminals and said first Zener diode, for supplying a first supply voltage when the power supply voltage has a first level;
a second Zener diode, operatively connected to said first power terminal, for supplying a second supply voltage when the power supply voltage has a second level;
first and second voltage supply terminals, operatively connected to said transistor and said second Zener diode, respectively, for outputting the first and second supply voltage when the power supply voltage has the first and second levels, respectively; and
first and second function circuits, operatively connected to the first and second voltage supply terminals, respectively, and to said second power terminal, for performing functions when supplied with power from a corresponding one of said first and second voltage supply terminals.

12. An electronic circuit device as recited in claim 11, wherein said first function circuit is an emitter-coupled-logic-type circuit and said second function circuit is a transistor-transistor-logic-type circuit.

13. An electronic circuit device as recited in claim 10, wherein said reference voltage generator circuit further comprises a diode operatively connected to said first transistor.

14. An electronic circuit device, operatively connected to receive a power supply voltage having a level, comprising:
first and second power terminals operatively connected to receive the power supply voltage;
switching means, comprising:
a first Zener diode operatively connected across said first and second power terminals;
a first transistor operatively connected to said first and second power terminals and said first Zener diode;
a second transistor, operatively connected to said first and second power terminals and said first transistor;
a third transistor, operatively connected to said first and second power terminals and said first and second transistors
a first voltage supply terminal operatively connected to said third transistor, for supplying power when the power supply voltage has a first level; and
a second voltage supply terminal, operatively connected to said first power terminal, for supplying power when the power supply voltage has the second level; and
first and second function circuits operatively connected to the first and second voltage supply terminals, respectively, for performing functions when supplied with power from a corresponding one of said first and second voltage supply terminals.

15. An electronic circuit device as recited in claim 14, wherein said switching means further comprises a temperature stabilizing circuit, operatively connected to said second transistor, for maintaining the power supplied by the first voltage supply terminal at a specified voltage level despite changes in temperature.

16. An electronic circuit device as recited in claim 15, wherein said temperature stabilizing circuit comprises:
   a resistor operatively connected to said third transistor;
   a fourth transistor operatively connected to said second transistor and said resistor; and
   a diode operatively connected to said fourth transistor.

17. An electronic circuit device as recited in claim 15, wherein said third transistor is a multi-emitter transistor having a first emitter operatively connected to said first voltage supply terminal and a second emitter operatively connected to said second transistor.

18. An electronic circuit device, operatively connected to a power source voltage having a level, comprising:
   an emitter-coupled-logic-type circuit;
   a transistor-transistor-logic-type circuit;
   power terminals operatively connected to receive the power source voltage;
   first switching means for completing connection of said emitter-coupled-logic-type circuit across the power terminals in dependence upon a first control signal;
   second switching means for completing connection of said transistor-transistor-logic-type circuit across said power terminals in dependence upon a second control signal; and
   control means, operatively connected to said power terminals and said first and second switching means, for generating the first control signal when the level of said power source voltage is less than a predetermined level and for generating the second control signal when the level of the power supply voltage is at least as large as the predetermined level.

* * * * *